[19] United States Patent
Henry et al.

[11] 4,001,793
[45] Jan. 4, 1977

[54] MAGNETIC BUBBLE DOMAIN COMPOSITE WITH HARD BUBBLE SUPPRESSION

[75] Inventors: Rodney D. Henry, Corona; Paul J. Besser, Laguna Niguel, both of Calif.

[73] Assignee: Rockwell International Corporation, El Segundo, Calif.

[22] Filed: Mar. 21, 1975

[21] Appl. No.: 560,859

Related U.S. Application Data

[63] Continuation of Ser. No. 375,999, July 2, 1973, abandoned.

[52] U.S. Cl. .................. 340/174 TF; 340/174 QA; 428/411; 428/539; 428/336; 427/47

[51] Int. Cl.² ........................................ G11C 11/14

[58] Field of Search .................. 427/127–132, 427/48; 156/600, 614; 428/538, 539, 900, 212, 213, 910; 340/174 TF, 174 QA, 174 NA

[56] References Cited
UNITED STATES PATENTS

| | | | |
|---|---|---|---|
| 3,429,740 | 2/1969 | Mee .............................. | 117/234 X |
| 3,573,099 | 3/1971 | Moore et al. ................. | 117/234 |
| 3,615,168 | 10/1971 | Wehmeier .................... | 117/235 X |
| 3,645,787 | 2/1972 | Mee .............................. | 117/235 X |
| 3,647,538 | 3/1972 | Wolfe ........................... | 117/234 |
| 3,697,320 | 10/1972 | Hiskes .......................... | 117/235 X |
| 3,728,152 | 4/1973 | Mee et al. ..................... | 117/235 |
| 3,728,153 | 4/1973 | Heinz ............................ | 117/239 |
| 3,741,802 | 6/1973 | Hagedorn et al. ............. | 117/235 X |
| 3,759,745 | 9/1973 | Dixon et al. .................. | 117/235 X |

*Primary Examiner*—George F. Lesmes
*Assistant Examiner*—William R. Dixon, Jr.
*Attorney, Agent, or Firm*—H. Fredrick Hamann; G. Donald Weber, Jr.; Robert Ochis

[57] ABSTRACT

A bubble domain composite for suppressing the formation of hard bubble domains comprises a magnetic garnet bubble domain layer, a non-magnetic substrate for supporting the bubble domain layer, and a magnetic hard bubble suppression layer that may be (1) grown on the substrate between the bubble domain layer and the supporting substrate or (2) grown directly on the bubble domain layer, which itself is grown on the substrate.

22 Claims, 4 Drawing Figures

MAGNETIC BUBBLE DOMAIN COMPOSITE WITH HARD BUBBLE SUPPRESSION

This is a continuation of application Ser. No. 375,999 filed July 2, 1973, now abandoned.

BACKGROUND OF THE INVENTION

1. Field of the Invention

This invention relates to materials in which magnetic bubble domains can be generated and, more particularly, to a multilayered composite including a layer of magnetic bubble domain material suitable for the selective generation of magnetic bubble domains.

2. Brief Description of the Prior Art

It is well known in the art to use magnetic materials such as garnets and orthoferrites with intrinsic and/or induced (by shape, stress or growth) uniaxial anisotropy to generate magnetic single wall or bubble domains. Typically, the bubble domains are generated by applying a suitable bias field perpendicular to a layer of magnetic bubble domain material. The normal bubble domains that are induced in such a material exist over a narrow range of bias field values, typically about 10 Oersteds, and propagate in the direction of an applied bias field gradient. However, in garnet materials, bubble domains may be formed that exist over a range of bias field values of as much as 40 Oersteds. In addition, these unusual bubble domains, termed hard bubbles, have low mobilities and propagate at an angle to the applied bias field gradient. Because of such properties, the presence of hard bubbles may render the garnet material unsuitable for use in bubble domain circuits and devices.

Several techniques are available for suppressing the formation of hard bubble domains. A double layer technique (Type I) is described in an article by A. H. Bobeck et al, published in the Bell System Technical Journal, Vol. 51, pgs. 1431–35, July-August, 1972. In this technique, a garnet layer of low magnetic moment is interposed between a garnet bubble domain layer and a substrate. The application of a suitable bias field to form bubble domains in the bubble layer saturates the suppression layer, precluding the formation of bubble domains therein and magnetizing the entire suppression layer antiparallel to the bubble domains. As a result of the antiparallel directions of magnetization, domain walls are formed between the intermediate layer and the bubble domains. These extra domain walls, termed 180° walls because of the antiparallel magnetization, apparently suppress the formation of hard bubbles by limiting the degrees of freedom available to the domain wall geometry. The usefulness of this suppression technique is limited by the propensity of the suppressed bubble layer to spontaneously generate unwanted bubbles.

Another double layer suppression technique (Type II) is described in the paper by A. H. Bobeck et al, supra. This technique utilizes a garnet bubble domain layer having a magnetization compensation temperature below room temperature. An underlying garnet layer possesses a lower moment and has a compensation temperature above room temperature. Upon application of an external bias field to form bubble domains in the bubble domain layer and to saturate the interposed film, the d-site Fe sublattices of the underlying layer and the non-bubble regions of the bubble domain layer are magnetized in antiparallel directions. This creates interfacial domain walls external to the bubble domains. That is, domain walls are created at the interface of the two layers between, but not along, the lower end of the bubble domains. The authors report that hard bubbles are eliminated by such a domain wall. However, as may be appreciated, the operability of this arrangement is limited to a narrow temperature range and may be temperature sensitive within that range.

A single-layer hard bubble suppression technique that utilizes ion implantation to form a wall or boundary in the upper surface of a magnetostrictive garnet bubble domain layer is described by R. Wolf and J. C. North in the Bell System Technical Journal, Vol 51, pgs. 1436–1440, July-August, 1972. The ion implantation is accomplished in a thin region in the upper surface of the garnet layer. The constraints exerted by the rest of the layer on the implanted region create a net moment of magnetization parallel to the surface. The magnetization of the implanted region apparently creates an extra domain wall in bubble domains induced in the uniplanted region of the layer, thereby eliminating hard bubble domains by decreasing the number of available degrees of freedom. However, the ion implantation technique is limited to garnet materials having negative magnetostriction constants of relatively large absolute values. In addition, the ion implanted region physically separates the generation and other device structures from the bubble domain layer and presumably renders bubble devices formed therefrom less efficient.

It may be thus appreciated that there exists a need for a bubble domain structure that efficiently suppresses the formation of hard bubble domains, is not temperature sensitive at normal operating temperatures, and is neither subject to difficulties such as the unwanted nucleation of bubbles nor to limitations such as the above-described magnetostriction requirements.

SUMMARY OF THE INVENTION

The present invention comprises a stratified composite in which magnetic bubble domains may be selectively generated. A layer of magnetic material (hereafter called the suppression layer) that is interposed between a non-magnetic substrate and a layer of bubble domain material has stress-induced anisotropy such that there is an easy axis of magnetization approximately parallel to the interfacial plane of the layers. Alternately, the suppression layer may be grown on the side of the bubble domain layer opposite the substrate.

Upon application of a bias field suitable for forming bubble domains in the bubble domain layer, and because the easy axis of magnetization of the suppression layer is parallel to the plane of the bubble domain layer, the interposed layer forms an extra domain wall at the interface of the layers in the end of the bubble domains. The extra domain wall does not hinder the formation, propagation, etc., of bubble domains having normal properties, but does preclude the formation of so-called hard bubble domains.

BRIEF DESCRIPTION OF THE DRAWINGS

In the drawings and in the following description, similar elements bear similar reference numerals.

DETAILED DESCRIPTION

Figure 1:
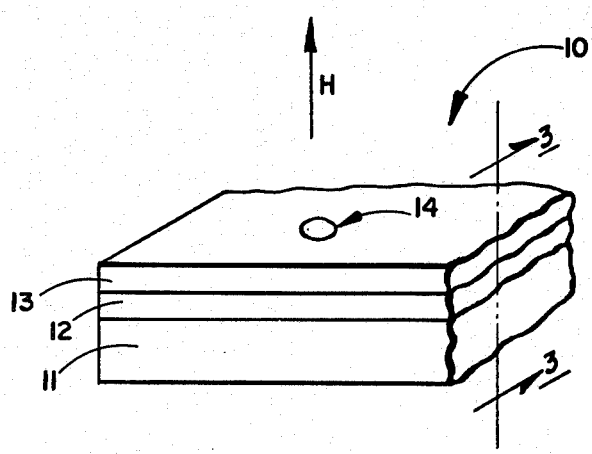
FIG. 1 is a partial, isometric view of one embodiment of a bubble domain composite constructed in accordance with the principles of the invention.

Referring now to FIG. 1, there is shown a partial, isometric representation of a bubble domain composite, designated generally by the reference numeral 10, constructed in accordance with the principles of the present invention. The bubble domain composite 10 includes a substrate 11 formed from a non-magnetic material. A magnetic, hard bubble suppression layer 12 is supported by the substrate 11. A magnetic layer 13 is supported by the layer 12 such that bubble domains can be generated within the layer 13 upon application of a suitable bias field.

Figure 2:
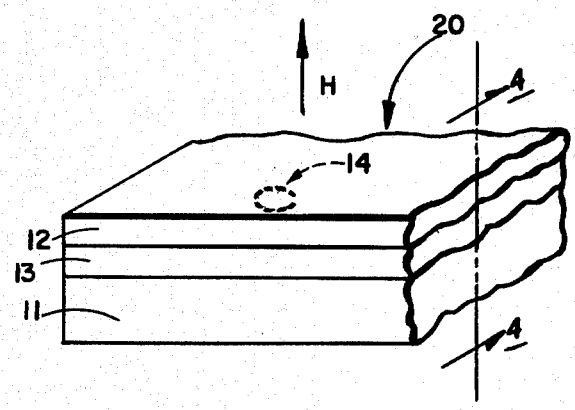
FIG. 2 is a partial, isometric view of an alternative embodiment of the bubble domain composite illustrated in FIG. 1.

FIG. 2 shows a bubble domain composite 20 comprising an aternative embodiment of the present invention in that the bubble domain layer 13 is grown directly on the substrate 11 and the suppression layer 12 is grown on the bubble domain layer.

In general, the substrate 11 typically comprises a monocrystalline oxide material, e.g. a metal oxide such as a non-magnetic garnet. The non-magnetic garnets are hereby considered to be oxides designated by the general formula $J_3Q_5O_{12}$, where J is at least one element selected from the lanthanide series of the Periodic Table, lanthanum, yttrium, magnesium, calcium, strontium, barium, lead, cadmium, lithium, sodium, and potassium. The Q constituent is at least one element selected from the group gallium, indium, scandium, titanium, vanadium, chromium, manganese, rhodium, zirconium, hafnium, molybdenum, niobium, tantalum, tungsten and aluminum.

The bubble domain layer 13 typically comprises a monocrystalline layer of material such as a substituted-iron garnet. The substituted iron garnets are hereby considered to be oxides designated by the general formula $J_3Q_5O_{12}$, where J is one or more of the elements of the lanthanide series of the Periodic Table, calcium, bismuth, lanthanum and yttrium, and Q is iron alone or iron and one or more elements selected from the group consisting of aluminum, chromium, gallium, indium, manganese, scandium, titanium and vanadium.

Referring generally to FIG. 1, the monocrystalline bubble domain layer 13 may be epitaxially grown on the suppression layer 12 (or the substrate 11, FIG. 2) using standard growth techniques such as liquid phase epitaxy (LPE), chemical vapor deposition (CVD), physical vapor deposition (PVD) and the like. The formation of composites of monocrystalline iron garnet bubble domain layers on a monocrystalline metallic oxide substrate is disclosed in copending U.S. Pat. application Ser. No. 233,832, now U.S. Pat. No. 3,946,124 which is a continuation of patent application U.S. Ser. No. 16,447 now abandoned and in U.S. Pat. No. 3,645,788, both to Mee et al and assigned to the common assignee, the teachings of both of which are incorporated herewith. As is known in the art, the generation of bubble domains in layers of magnetic garnet material requires that the layer be grown such that induced magnetic anisotropy in the layer provides a sufficient easy axis of magnetization approximately normal to the layer plane. Accordingly, induced magnetic anisotropy, i.e. an induced easy axis of magnetization, is used where the bubble domain layer 13 is a garnet. Preferably, this induced easy axis coincides with one of the crystallographic (intrinsic) easy axes.

The hard bubble suppression layer 12 is typically formed from a high magnetization substituted-iron garnet. The layer 12 may be grown on the substrate 11 (or the bubble domain layer 13, FIG. 2) using any of several standard techniques, including LPE, CVD, and PVD. The garnet suppression layer 12 is grown such that shape-, growth-, or stress-induced magnetic anisotropy generates an easy axis of magnetization in the plane of the layer.

Shape, growth and stress techniques for inducing magnetic anisotropy in materials such as garnets are known in the art. Briefly, shape-induced magnetic anisotropy arises from the demagnetizing effects of surface poles for a thin film geometry. This contribution to the anisotropy always favors an in-plane magnetization in a thin film sample.

Growth-induced magnetic anisotropy derives mainly from preferential occupation of certain crystal lattice sites by the atoms of the J series (in the $J_3Q_5O_{12}$ formulation).

Finally, stress induced magnetic anisotropy has been attained for garnet materials by a lattice constant mismatch technique utilizing either compositional adjustments or ion implantation. See, for example, *A Stress Model for Heteroepitaxial Magnetic Oxide Films Grown by Chemical Vapor Deposition*, Material Research Bulletin, Vol. 6, pgs. 1111–24 (1971) by P. J. Besser et al. Application of the lattice constant mismatch technique is disclosed in U.S. Pat. Nos. 3,728,152; 3,745,046; and 3,788,896, all issued to Mee et al and assigned to the assignee of this patent.

The present invention utilizes lattice constant mismatch between the materials of the suppression layer 12 and the substrate 11 or the bubble domain layer 13 to stress the suppression layer thereby to induce net magnetization parallel to the plane of the layer. This induced anisotropy is independent of the magnetic properties of the bubble domain layer 13.

Stress-induced anisotropy is a relatively simple, easily controlled process. Indeed, because the stress-induced anisotropy used for the suppression layer 12 is based upon lattice constant mismatch between the suppression layer and the substrate 11 or the bubble domain layer 13, once compatible materials have been selected, the induced stress is a natural consequence of growing the layer.

For the magnetic iron garnets, the magnetization possesses the symmetry of the garnets' cubic crystal structure in that several equivalent crystallographic directions, such as <100> or <111> directions, may be an easy axis of magnetization. Then, to generate anisotropy necessary for the generation of bubble domains, a layer of the garnet is grown with the plane thereof perpendicular to the desired direction, i.e. with the plane of the layer being a {100} or {111} plane. Depending upon whether the magnetostriction constant, $\lambda_{100}$ or $\lambda_{111}$, associated with the crystallographic direction is positive or negative, the bubble domain material is grown on a material (such as the substrate 11 or the suppression layer 12) of sufficiently different lattice constants so that the layer is placed in compression or tension, respectively, along the plane of the layer. The resulting strain creates a unique easy axis of magnetization substantially parallel to the <100> or <111> direction and approximately normal to the plane of the layer. (The growth-induced anisotropy also produces a unique easy axis in the garnet materials.) Application of a suitable bias field perpendicular to the plane of the layer may then be used to generate bubble domains. The direction of such a bias field, H, is arbitrarily represented by an arrow in FIGS. 1 and 2.

The converse of the preceding technique is used in the present invention for the hard bubble suppression layer 12 where this layer is a garnet material. A magnetic garnet material of positive or negative magnetostriction constant is chosen so that the lattice constant mismatch between the suppression layer 12 and the bubble domain layer 13 or the substrate 11 will place the suppression layer in tension or compression, respectively. The resulting strain creates an easy axis of the magnetization in the plane of the suppression layer, rather than perpendicular to the layer as discussed for the bubble domain layer 13.

Figure 3:
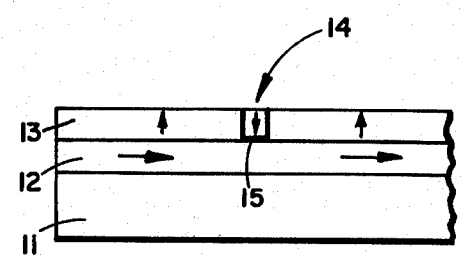
FIG. 3 is a cross-sectional view, taken along the line 3—3 in FIG. 1, illustrating the bubble domains generated within the composite.
Figure 4:
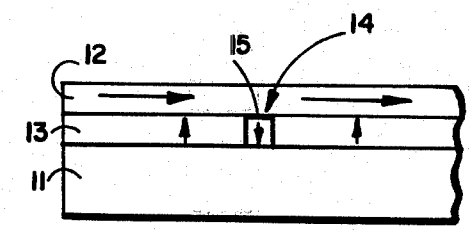
FIG. 4 is a cross-sectional view, taken along the line 4—4 in FIG. 2, illustrating the bubble domains generated within the composite comprising the alternative embodiment.

Referring further to FIGS. 1 and 2, and assuming the easy axes of magnetization in the suppression layer 12 and the bubble domain layer 13 are approximately perpendicular to each other, the application of the bias field K generates cylindrical single wall or bubble domains 14 in the bubble domain layer. Only one bubble domain 14 is illustrated for convenience and clarity. The induced anistropy maintains the magnetizatin in the plane of the suppression layer 12 substantially parallel to the interface between the bubble domain layer 13 and the suppression layer and perpendicular to the height of the bubble domains 14, as illustrated by the arrows in FIGS. 3 and 4. The perpendicular or ninety degree magnetization of the suppression layer 13 relative to the bubble domain 14 forms an additional domain wall 15 at the interface of the suppression layer 12 and the single wall domains 14-14, as shown in FIGS. 3 and 4.

Although the mechanism by which the additional domain wall 15 suppresses the formation of hard bubbles is not fully understood, it is believed that the degree of freedom available to the bubble domains 14 are decreased to a number that precludes the existence of hard bubbles, yet is consistent with the existence of bubbles having nearly normal characteristics.

EXAMPLES

Table 1 summarizes the parameters utilized and results obtained using various compositions of material in a composite made according to the present invention. The suppression and bubble domain layers were grown using the LPE method reported by Levinstein et al in Applied Physics Letters, Vol. 19, pgs. 486–88, Dec. 1971. This report, which is hereby incorporated by reference, teaches a 920° C growth temperature using the LPE dipping method and $PbO-B_2O_3$ flux. The films were deposited using horizontal substrates that were rotated 30 to 100 rpm, as described by Geiss et al, Journal of Crystal Growth, Vol. 16, p. 36, 1972.

The material composition used for the substrate throughout was $Gd_3Ga_5O_{12}$ (gadolinium gallium garnet or "GGG"). The composition chosen for the suppression layer was $(YGd)_3Fe_5O_{12}$ (mixed yttrium gadolinium iron garnet, or "YGdIG"). Specifically, the composition was $Y_{2.46}Gd_{0.54}Fe_5O_{12}$, which gave the desired effect of placing the suppression layer of negative magnetostriction constant in compression for the substrate and bubble domain compositions used, infra.

Referring further to Table 1, composite A was obtained by growing a YGdIG suppression layer 0.2 micron thick on the substrate and growing a $(YGdTm)_3$-$(FeGa)_5O_{12}$ bubble domain layer on the suppression layer (see also FIG. 1). Composites B, C and D were obtained by growing $(YGdTm)_3(FeGa)_5O_{12}$, $(EuEr)_3$-$(FeGa)_5O_{12}$ and $(YEu)_3(FeGa)_5O_{12}$ bubble domain layers, respectively, on the substrate and then growing a 0.2 micron thick YGdIG suppression layer on the bubble layers (see FIG. 2).

TABLE 1

| MATERIALS AND CONDITIONS | A | B | C | D |
|---|---|---|---|---|
| BUBBLE DOMAIN LAYER | $(YGdTm)_3(FeGa)_5O_{12}$ | $(YGdTm)_3(FeGa)_5O_{12}$ | $(EuEr)_3(FeGa)_5O_{12}$ | $(YEu)_3(FeGa)_5O_{12}$ |
| OUTER LAYER (FIG. 1) | X | | | |
| INNER LAYER (FIG. 2) | | X | X | X |
| SUPPRESSION LAYER | $(YGd)_3Fe_5O_{12}$ | $(YGd)_3Fe_5O_{12}$ | $(YGd)_3Fe_5O_{12}$ | $(YGd)_3Fe_5O_{12}$ |
| THICKNESS, MICRON | 0.2 | 0.2 | 0.2 | 0.2 |
| MAGNETOSTRICTION CONSTANT | NEGATIVE | NEGATIVE | NEGATIVE | NEGATIVE |
| APPLIED STRESS | COMPRESSION | COMPRESSION | COMPRESSION | COMPRESSION |
| SUBSTRATE | $Gd_3Ga_5O_{12}$ | $Gd_3Ga_5O_{12}$ | $Gd_3Ga_5O_{12}$ | $Gd_3Ga_5O_{12}$ |
| GROWTH METHOD | LPE | LPE | LPE | LPE |
| FLUX (LPE) | $PbO-B_2O_3$ | $PbO-B_2O_3$ | $PbO-B_2O_3$ | $PbO-B_2O_3$ |
| TEMP. ° C | 920 | 920 | 920 | 920 |
| COLLAPSE FIELD RANGE, $\Delta H$ (ORSTED), W/SUPPRESSION LAYER | <2 | <2 | <2 | <2 |
| COLLAPSE FIELD (OERSTED) W/O SUPPRESSION LAYER | >25 | >25 | >25 | >25 |
| PROPAGATION TRACK OPERATING MARGIN | 15 Oe at 125 kHz | — | — | — |

Various characterization techniques were applied to ascertain the presence or absence of hard bubble domains. First, the range of values of the bias field necessary for bubble collapse ($\Delta H$, Oersted) was determined for the suppressed composites and compared to values of $\Delta H$ for composites of the same bubble domain and substrate materials without a suppression layer. As shown in Table 1, the collapse field range values for the suppressed composites are all 2 Oe. or less and are well within the acknowledged range for normal bubbles. In contrast, $\Delta H$ was in excess of 25 Oe. for each of the unsuppressed composites, a range that is typical when hard bubbles are present.

Second, field gradients were applied in the plane of the suppressed bubble domain layers. The bubble domains in the layers propagated parallel to the direction of the gradient, as would be expected of normal bubbles, and not at angles to the gradient, as expected of hard bubbles.

Third, the mobility of the bubble domains in suppressed composite A (interposed suppression layer 12) was tested by incorporating the composite into a three bar chevron propagation track (not shown). The device operating margins were about 15 Oe. for continuous operation at 125 kHz. This is about the same margin measured for ion implanted films. Reliable continuous operation cannot be obtained at 125 kHz without suppression.

Mobility and coercive field measurements were obtained using both suppressed and unsuppressed composites. The results (not shown in Table 1) indicated that within the accuracy of the measurements (± 10% for bubble velocity, ± 20% for drive fields) there were no detrimental effects due to suppression.

It should be noted that the bubble domain materials listed in Table 1, columns C and D, that is $(EuEr)_3(GaFe)_5O_{12}$ and $(YEu)_3(GaFe)_5O_{12}$, are deemed unsuitable for suppression techniques such as ion implantation. In the case of the EuEr garnet, growth-induced anisotropy makes stress-induced anisotropy during ion implantation such that large ion doses are necessary. The YEu garnet is unsuitable for ion implantation unlike the $Y(GdTm)_3(FeGa)_5O_{12}$ composition used as the bubble domain layer in samples A and B and the $(EuEr)_3(FeGa)_5O_{12}$ composition used as the bubble domain layer in sample C, each of which has a negative magnetostriction constant, the YEu garnet has a small magnetostriction constant that may be either positive or negative. In contrast to their incompatibility with ion implantation and as evidenced in Table 1, both the EuEr garnet and the YEu garnet are well suited for use in hard bubble domain suppression composites in accordance with the present invention.

The thickness of the suppression layer 12 has been found to be important in some cases. For example, if the YGdIG suppression layer is grown to a thickness of 0.5 µm or more, device performance is inhibited, presumably as a result of strong domain interactions which are observed.

Thus, there has been described a stratified magnetic bubble domain composite for suppressing the formation of hard bubbles. Exemplary compositions, arrangements and the like have been demonstrated. Alternative parameters and materials have been indicated. The scope of the invention is limited, however, only by the claims appended hereto and equivalents.

Having thus described preferred embodiments of the invention, what is claimed is:

1. A stratified composite comprising:
   a non-magnetic, monocrystalline garnet substrate;
   a bubble domain layer of an epitaxially grown monocrystalline magnetic garnet material, said bubble domain layer overlying said substrate, having a major surface and having sufficient uniaxial anisotropy to enable the formation of bubble domains therein;
   a hard bubble suppression layer of an epitaxially grown monocrystalline magnetic garnet material, said hard bubble suppression layer overlying said substrate on the same side as said bubble domain layer, having a major surface, a thickness of less than about 0.5 µ and sufficient anisotropy to establish a net moment of magnetization substantially parallel to said major surface of said hard bubble suppression layer;
   said bubble domain and hard bubble suppression layers having their major surfaces substantially parallel; and
   said substrate supporting said layers along their major surfaces.

2. The stratified composite recited in claim 1 wherein said hard bubble suppression layer is interposed between said substrate and bubble domain layer.

3. The stratified composite recited in claim 1 wherein said bubble domain layer is interposed between said substrate and said hard bubble suppression layer.

4. The stratified composite recited in claim 1 wherein said bubble domain and hard bubble suppression layers are of a formulation $J_3Q_5O_{12}$, in which J is one or more of calcium, bismuth, lanthanum, yttrium, and the lanthanide elements and Q is iron alone or iron and one or more of aluminum, chromium, gallium, indium, manganese, scandium, titanium and vanadium.

5. The stratified composite recited in claim 1 wherein said monocrystalline garnet substrate is of a formulation $J_3Q_5O_{12}$, in which J is at least one element selected from the lanthanide elements, lanthanum, yttrium, magnesium, calcium, strontium, barium, lead, cadmium, lithium, sodium and potassium and Q is one or more of gallium, indium, scandium, titanium, vanadium, chromium, manganese, rhodium, zirconium, hafnium, molybdenum, niobium, tantalum, tungsten and aluminum.

6. The stratified composite recited in claim 4 wherein said hard bubble suppression layer has the composition $(YGd)_3Fe_5O_{12}$ and is less than about 0.5 µm thick.

7. The stratified composite recited in claim 6 wherein said $(YGd)_3Fe_5O_{12}$ layer is approximately 0.2 µm thick.

8. The stratified composite recited in claim 4 wherein said bubble domain layer has a negative magnetostriction constant.

9. The stratified composite recited in claim 4 wherein said bubble domain layer has a positive magnetostriction constant.

10. The stratified composite recited in claim 8 wherein said bubble domain layer has the composition $(YGdTm)_3(FeGa)_5O_{12}$.

11. The stratified composite recited in claim 8 wherein said bubble domain layer has the composition $(EuEr)_3(FeGa)_5O_{12}$.

12. The stratified composite recited in claim 8 wherein said bubble domain layer has the composition $(Yeu)_3(FeGa)_5O_{12}$.

13. The stratified composite recited in claim 9, wherein said bubble domain layer has the composition $(YEu)_3(FeGa)_5O_{12}$.

14. A stratified composite comprising:
   a non-magnetic monocrystalline garnet substrate of the formulation $J_3Q_5O_{12}$, in which J is at least one element selected from the lanthanide elements lanthanum, yttrium, magnesium, calcium, strontium, barium, lead, cadmium, lithium, sodium and potassium and Q is one or more of gallium, indium, scandium, titanium, vanadium, chromium, manganese, rhodium, zirconium, hafnium, molybdenum, niobium, tantalum, tungsten and aluminum;
   a bubble domain layer of an epitaxially grown monocrystalline magnetic garnet material, said bubble domain layer capable of forming magnetic bubble domains therein and having a major surface;

a hard bubble suppression layer of an epitaxially grown monocrystalline magnetic garnet material, said hard bubble suppression layer suppressing the formation of hard-bubble-domains, said hard bubble suppression layer having a thickness of less than $0.5\mu$ and a major surface, said major surface of said bubble domain layer substantially parallel to said major surface of said hard bubble suppression layer, and said hard bubble suppression layer having anisotropy such that the net magnetic moment therein is substantially parallel to the plane of said bubble domain layer;

said bubble domain and hard bubble suppression layers each having the formulation $J_3Q_5O_{12}$, in which J is one or more of calcium, bismuth, lanthanum, yttrium, and the lanthanide elements and Q is iron alone or iron and one of more of aluminum, chromium, gallium, indium, manganese, scandium, titanium and vanadium, said first and second layers having different compositions;

one of said bubble domain and hard bubble suppression layers epitaxially grown on said non-magnetic garnet substrate; and the other of said layers epitaxially grown on said one layer.

15. The stratified composite recited in claim 14 herein said bubble domain layer is interposed between said substrate and said hard bubble suppression layer.

16. The stratified composite recited in claim 15 wherein said hard bubble suppression layer has a positive magnetostriction constant and is supported on said bubble domain layer in tension.

17. The stratified composite recited in claim 15 wherein said hard bubble suppression layer has a negative magnetostriction constant and is supported in compression on said bubble domain layer.

18. The stratified composite recited in claim 17 wherein said hard bubble suppression layer is of composition $(YGd)_3Fe_5O_{12}$.

19. The stratified composite recited in claim 14 wherein said hard bubble suppression layer is interposed between said substrate and said bubble domain layer.

20. The stratified composite recited in claim 19 wherein said hard bubble suppression layer has a positive magnetostriction constant and is supported in tension on said substrate.

21. The stratified composite recited in claim 19 wherein said hard bubble suppression layer has a negative magnetostriction constant and is supported in compression on said substrate.

22. The stratified composite recited in claim 21 wherein said hard bubble suppression layer is of composition $(YGd)_3Fe_5O_{12}$.

* * * * *